US012578770B2

(12) United States Patent
Lewis et al.

(10) Patent No.: US 12,578,770 B2
(45) Date of Patent: Mar. 17, 2026

(54) HINGE MECHANISM FOR MOUNTING A PRINTED CIRCUIT BOARD IN AN INFORMATION HANDLING SYSTEM

(71) Applicant: DELL PRODUCTS L.P., Round Rock, TX (US)

(72) Inventors: Jeffrey M. Lewis, Maynard, MA (US); Nicholas R. Laviolette, Sudbury, MA (US)

(73) Assignee: Dell Products L.P., Round Rock, TX (US)

( * ) Notice: Subject to any disclaimer, the term of this patent is extended or adjusted under 35 U.S.C. 154(b) by 95 days.

(21) Appl. No.: 18/649,062

(22) Filed: Apr. 29, 2024

(65) Prior Publication Data

US 2025/0335010 A1      Oct. 30, 2025

(51) Int. Cl.
G06F 1/18 (2006.01)
G06F 1/185 (2026.01)
H05K 7/14 (2006.01)

(52) U.S. Cl.
CPC ........... G06F 1/185 (2013.01); H05K 7/1418 (2013.01)

(58) Field of Classification Search
CPC .. H05K 7/1418; H05K 7/1429; H05K 7/1409; G06F 1/185
See application file for complete search history.

(56) References Cited

U.S. PATENT DOCUMENTS

| | | | | |
|---|---|---|---|---|
| 5,155,663 A * | 10/1992 | Harase | ............. | G06K 19/07732 361/740 |
| 5,642,263 A * | 6/1997 | Lauruhn | ................. | G06F 1/185 361/740 |
| 5,831,821 A * | 11/1998 | Scholder | .............. | H05K 7/1429 361/679.58 |
| 7,929,317 B2 * | 4/2011 | Cheng | .................. | H05K 7/1429 361/801 |
| 10,852,784 B2 | 12/2020 | Schnell et al. | | |
| 11,347,279 B2 | 5/2022 | Schnell et al. | | |

* cited by examiner

*Primary Examiner* — James Wu
(74) *Attorney, Agent, or Firm* — Larson Newman, LLP

(57) ABSTRACT

An information handling system includes an interconnect card, a first card guide, and a second card guide. The first card guide is in physical communication with the interconnect card. The second card guide is in physical communication with the interconnect card. The second card guide includes a hinge arm configured to transition between an open position and a locked position. The hinge arm is in the open position when the interconnect card is inserted in between the first and second card guides. The hinge arm is in the locked position to secure the interconnect card when the interconnect card is positioned between the first and second card guides.

15 Claims, 7 Drawing Sheets

HINGE MECHANISM FOR MOUNTING A PRINTED CIRCUIT BOARD IN AN INFORMATION HANDLING SYSTEM

FIELD OF THE DISCLOSURE

The present disclosure generally relates to information handling systems, and more particularly relates to a hinge mechanism for mounting a printed circuit board in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes an interconnect card, a first card guide, and a second card guide. The first card guide is in physical communication with the interconnect card. The second card guide is in physical communication with the interconnect card. The second card guide includes a hinge arm configured to transition between an open position and a locked position. The hinge arm may be in the open position when the interconnect card is inserted in between the first and second card guides. The hinge arm may be in the locked position to secure the interconnect card when the interconnect card is positioned between the first and second card guides.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

Figure 1:
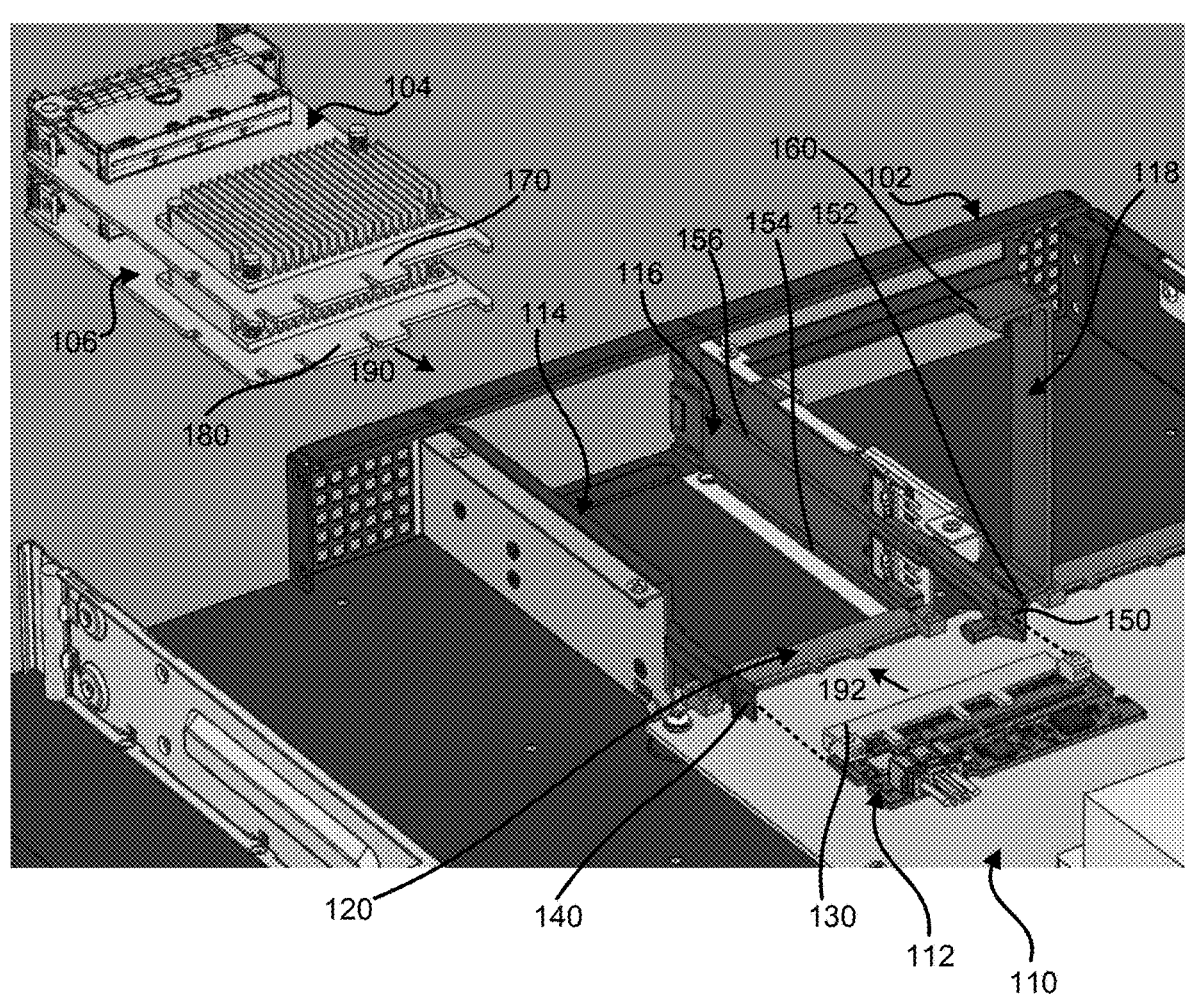
FIGS. 1-7 are perspective views of a portion of an information handling system including an option card at different connection stages according to at least one embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

FIGS. 1-7 illustrate an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a chassis 102 and option cards 104 and 106. Chassis 102 includes different components including, but not limited to, a main board 110, an interconnect card 112, card guides 114 and 116, and a hinge arm 118. Main board 110 includes a connector 120. Similarly, interconnect card 112 includes a connector 130. In an example, interconnect card 112 may be any suitable type of printed circuit board (PCB) for use in information handling system 100. Card guide 114 includes a snap lock component 140. Card guide 116 includes a snap lock component 150, a hinge joint 152, and card guide channels 154 and 156. In an example, card guide 116 includes card guide channels that are substantially parallel with card guide channels 154 and 156. Hinge arm 118 includes a flex latch 160. Option card 104 includes a connector 170, and option card 106 includes a connector 180. While only two pairs of card guide channels 154 and 156 are illustrated, card guides 114 and 116 may include additional card guide channels based on a number of option cards to be inserted within information handling system 100 and based on a height of the information handling system without varying from the scope of this disclosure. Information handling system 100 may include additional components without varying from the scope of this disclosure.

Referring now to FIG. 1, each set of card guide channels, such channel 154 and corresponding channel on card guide 114 and channel 156 and corresponding channel on card guide 114, may receive a different one of option cards 104 and 106. In an example, channels 154 and 156 and corresponding channels on card guide 114, may include an alignment portion at the edge of chassis 102. The alignment portions may enable options cards 104 and 106 to slide slightly up or down within corresponding card guide channels 154 and 156 such that the option cards may be properly aligned within the channel. In an example, option card 106 may slide in the direction of arrow 190 within card guide channel 154. When option card 106 is fully inserted within card guide channel 154, connector 180 may be completely plugged into connector 130. Based on connector 180 being plugged into connector 130, option card 106 may communicate with other components of information handling system 100 including, but not limited to, components on main board 110.

In certain examples, interconnect card 112 may be any suitable type of card including, but not limited to, a paddle PCB card and a floating-point operation (FLOP) PCB card. In an example, interconnect card 112 may be changed, replaced, or the like based on the type of option card 104 to be plugged into the interconnect card. In certain examples, interconnect card 112 may be pushed into snap lock components 140 and 150 of respective card guides 114 and 116 in the direction of arrow 192. In an example, interconnect card 112 may be secured between snap lock components 140 and 150 of respective card guides 114 and 116 but may be removed if the interconnect card should be changed based on a different option card 104 being used in information handling system 100. Therefore, snap lock components 140 and 150 may removably secure interconnect card 112 within information handling system 100 as will be described with respect to FIG. 2 below.

Figure 2:
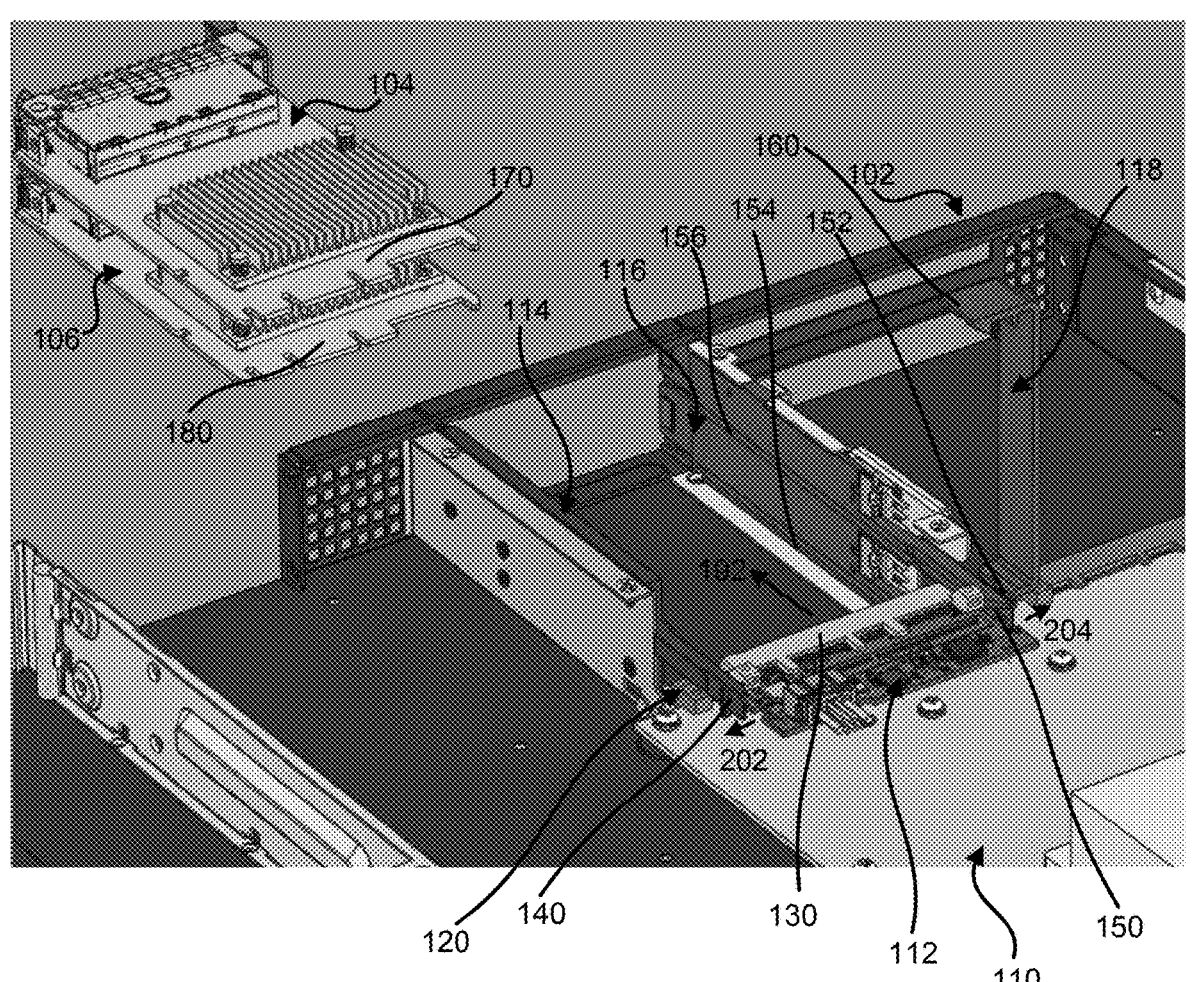

Referring to FIG. 2, as interconnect card 112 is continually pushed in the direction of arrow 192, the edges of interconnect card may cause snap lock components 140 and 150 to flex away from the edges of the interconnect card. For example, as interconnect card 112 slides within card guide channel 156 and the corresponding card guide channel of card guide 114, snap lock component 140 may flex in the direction of arrow 202 and snap lock component 150 may flex in the direction of arrow 204. In certain examples, the flexing of snap lock components 140 and 150 in the directions of respective arrows 202 and 204 may continue until the entire interconnect card 112 is past the end of both of the snap lock components. At this point, snap lock components 140 and 150 may snap fit around the back of interconnect card 112 as will be described with respect to FIG. 3.

Figure 3:
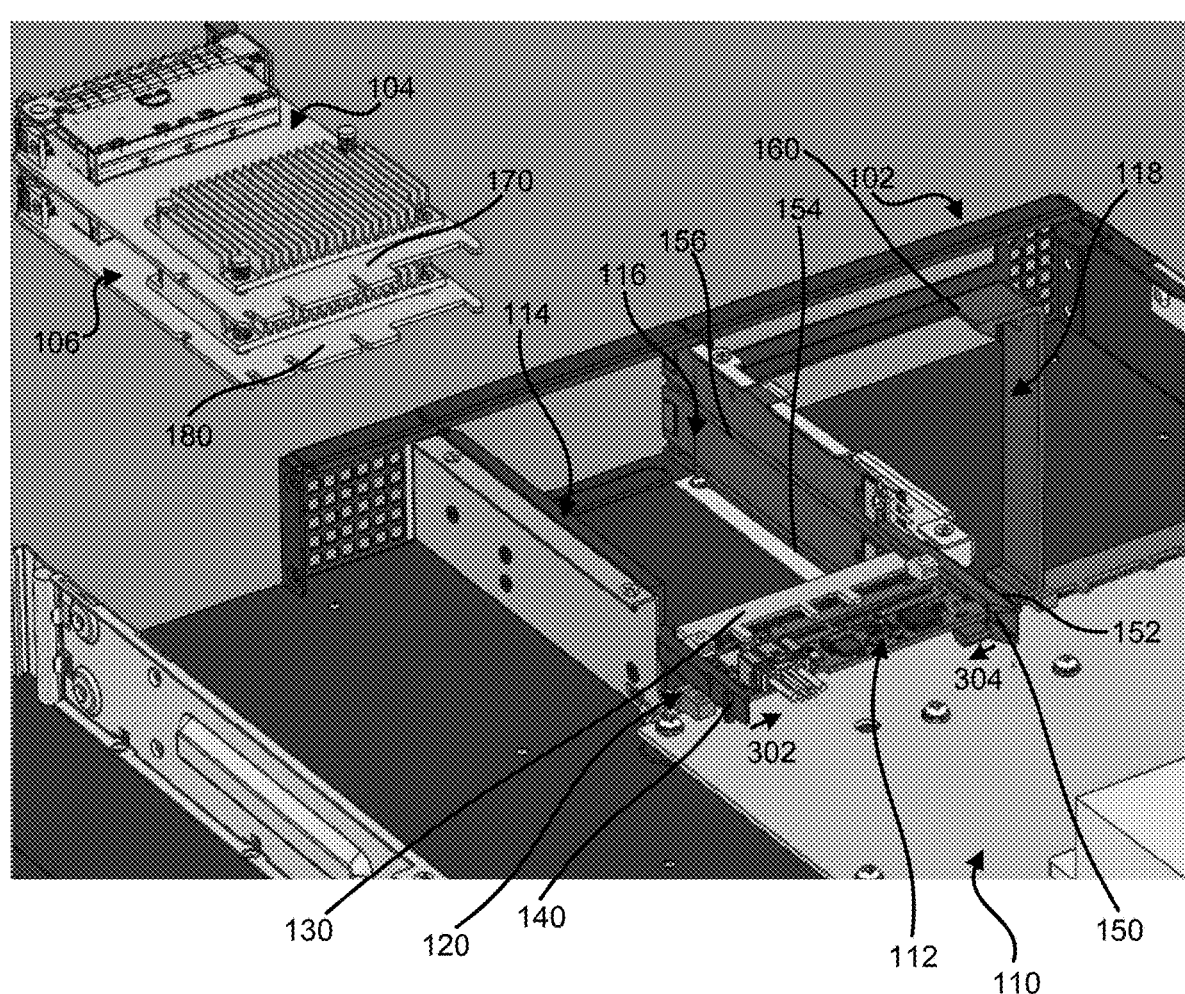

Referring to FIG. 3, snap lock component 140 may include a notch at the end of the ramped portion and the notch may enable snap lock component to snap fit around the back corner of interconnect card 112. In an example, when the back corner of interconnect card 112 slides beyond the ramp portion of snap lock component 140, the back corner may slip into the notch and the snap lock component may rebound in the direction of arrow 302 and snap fit around the back corner. The movement of snap lock component 140 in the direction of arrow 302 may enable the snap lock component to return to an initial position and hold interconnect card 112 within card guide channel of card guide 114.

In an example, snap lock component 150 may include a notch at the end of the ramped portion and the notch may enable snap lock component to snap fit around the other back corner of interconnect card 112. When this back corner of interconnect card 112 slides beyond the ramp portion of snap lock component 150, the back corner may slip into the notch and the snap lock component may rebound in the direction of arrow 304 and snap fit around the back corner. The movement of snap lock component 150 in the direction of arrow 304 may enable the snap lock component to return to an initial position and hold interconnect card 112 within card guide channel 156 of card guide 116. When interconnect card 112 is securing held within card guides 114 and 116, snap lock components 140 and 150 of respective card guides 114 and 116 may suspend interconnect card 112 in space above main board 110.

Figure 4:
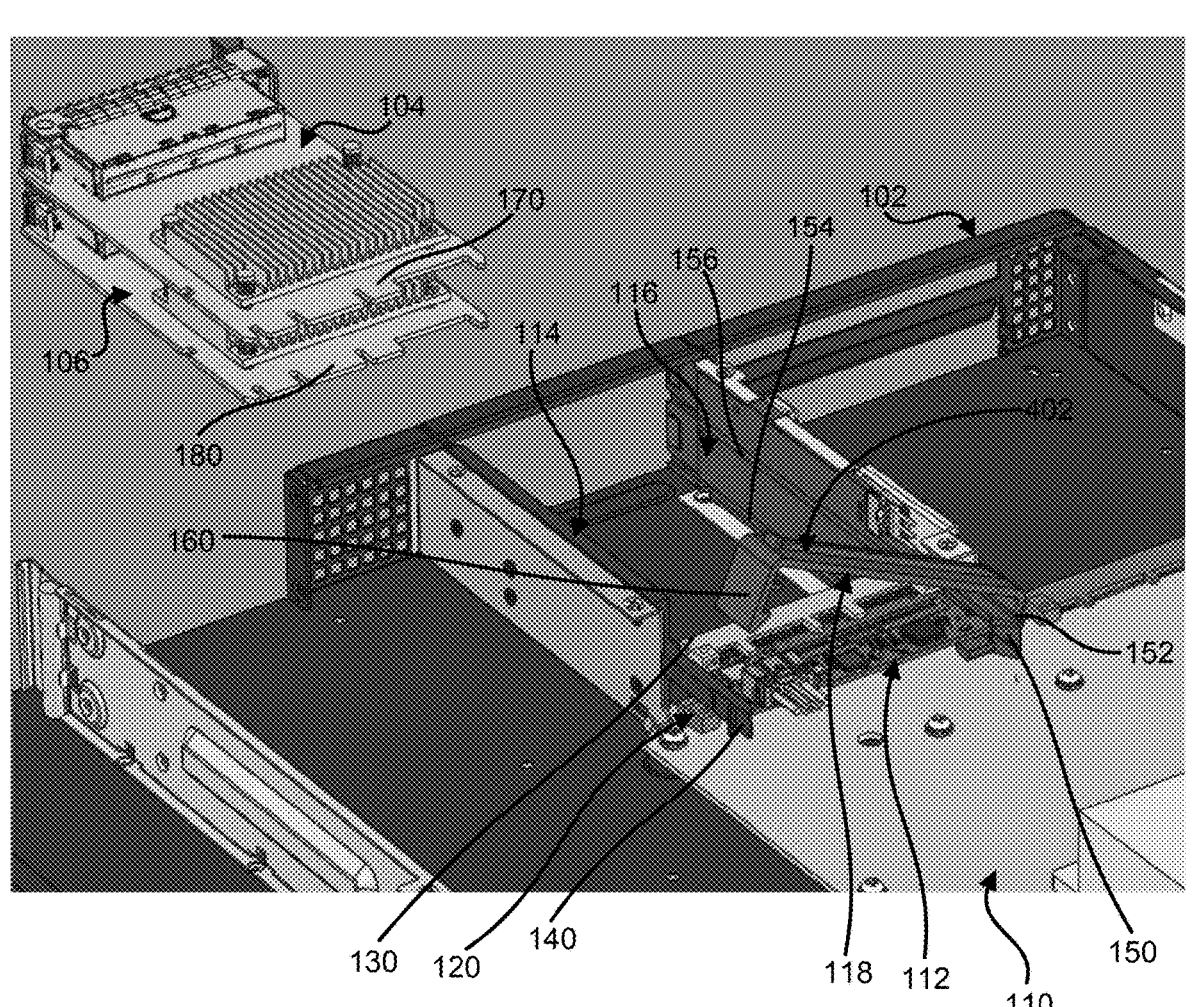

Referring to FIG. 4, when snap lock components 140 and 150 are snap fitted around the back corner of interconnect card 112, hinge arm 118 may be rotated away from an initial or open position in the direction of arrow 402. In certain examples, snap lock component 140 includes a rib portion to interface within flex latch 160 of hinge arm 118 as will be described with respect to FIG. 5 below. In an example, as hinge arm 118 rotates in the direction of arrow 402, hinge joint 152 may flex to enable the hinge arm to transition from the open position to a locked position. In certain examples, hinge joint 152 may be an all-in-one component with snap lock component 150 and hinge arm 118. For example, hinge arm 118, snap lock component 150, and hinge joint 152 may be molded from any suitable plastic material, such as polypropylene. Based on the material of hinge joint 152, the hinge joint may flex and back and forth without breaking. In this example, hinge joint 152 may be referred to as a living hinge based on the ability of the hinge joint to flex without breaking. As hinge arm 118 continues to rotate in the direction of arrow 402, flex latch 160 may be placed in physical communication with snap lock component 140 as described with respect to FIG. 5.

Figure 5:
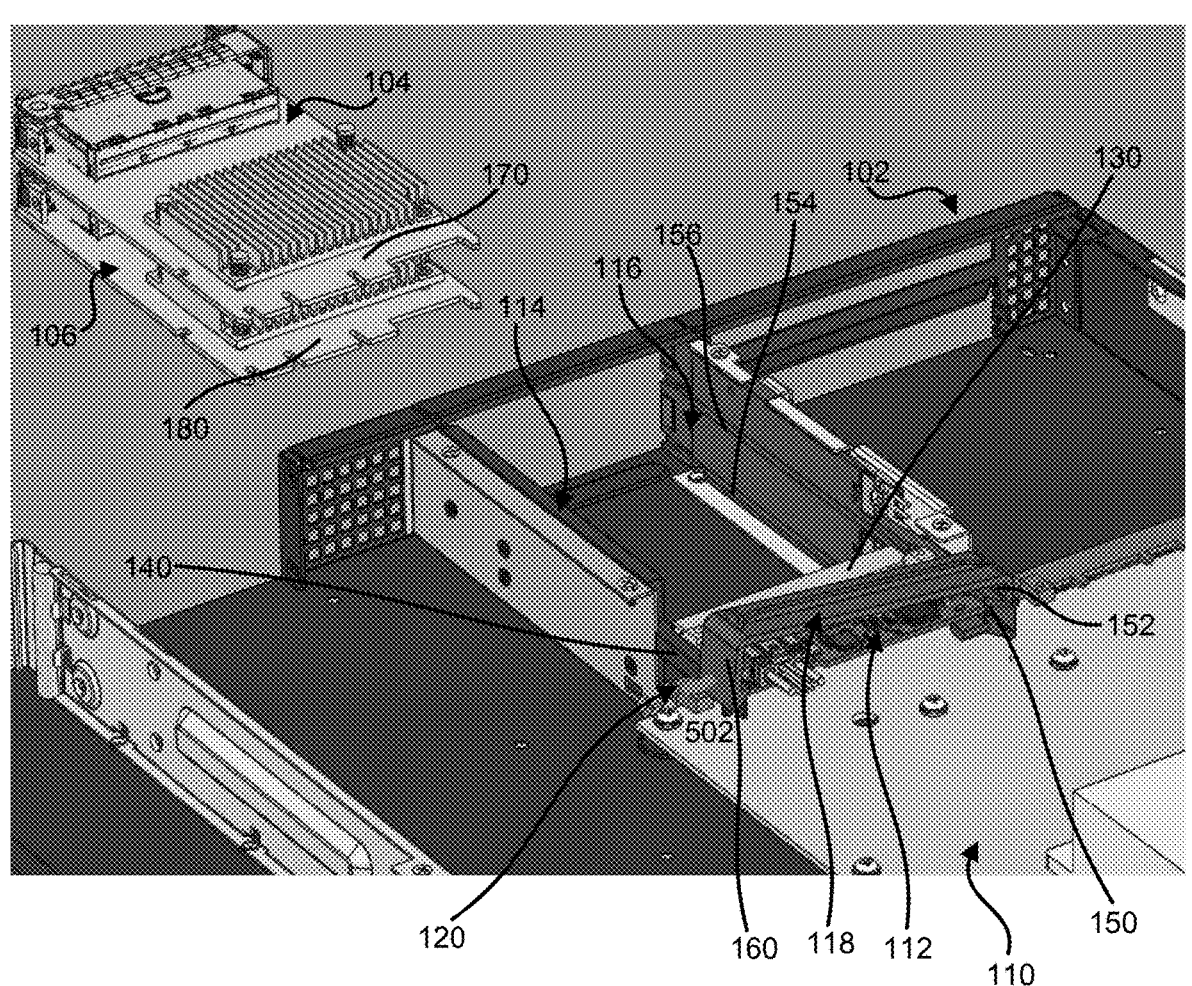

Referring to FIG. 5, as hinge arm 118 approaches the locked position, a ramp portion of flex latch 160 may be placed in physical communication with snap lock component 140. In an example, a groove within the ramp portion of flex latch 160 may slide around the rib portion of snap lock component 140 so that the flex latch may be properly aligned on the snap lock component. In certain examples, as hinge arm 118 is pushed downward onto snap lock component 140, the ramp portion of flex latch 160 may force the flex latch to flex away from the snap lock component in the direction of arrow 502. When the ramp portion of flex latch 160 is beyond a bottom edge of snap lock component 140, the flex latch may snap fit over the snap lock component as shown in FIG. 6.

Figure 6:
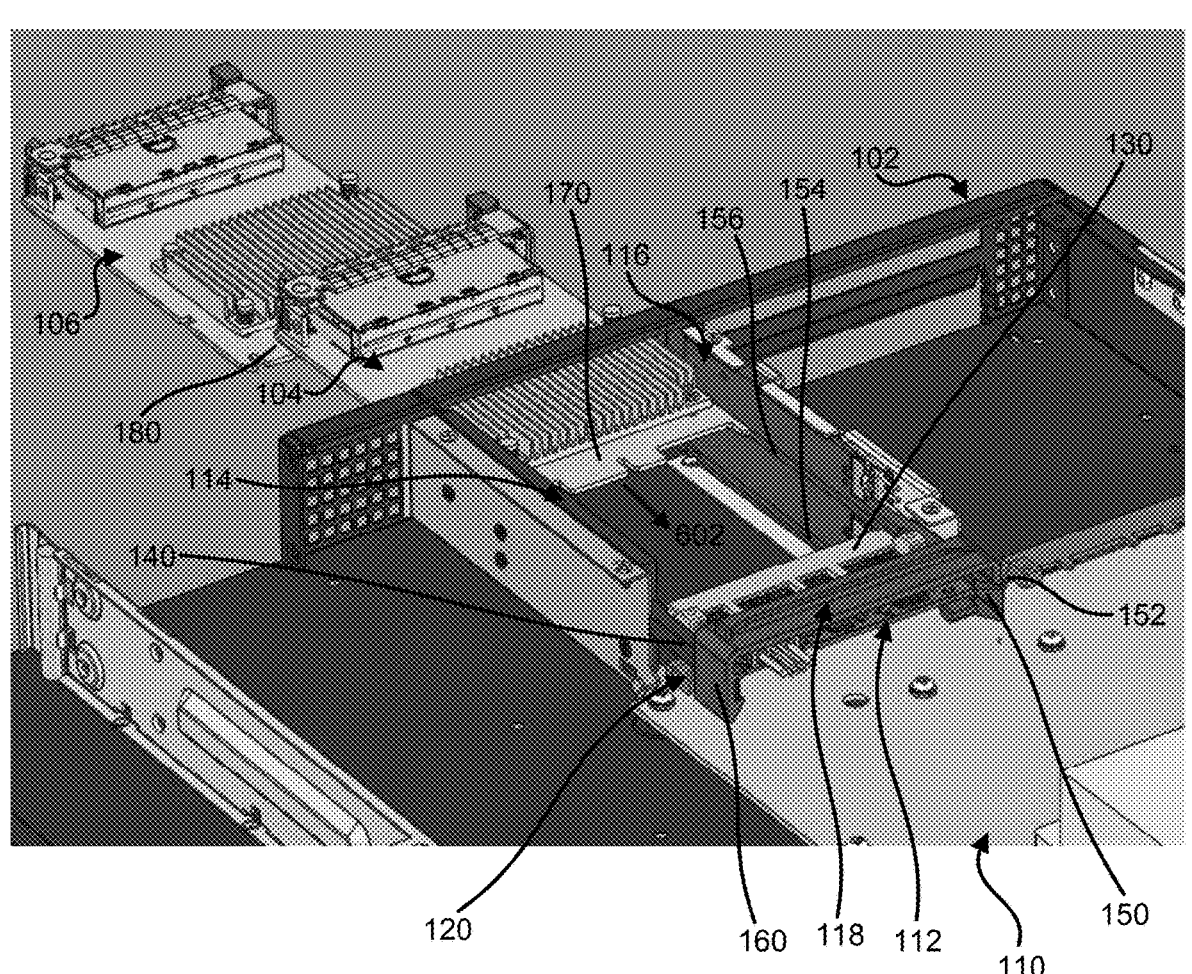

Referring to FIG. 6, when flex latch 160 is snap fitted over snap lock component 140, hinge arm 118 may prevent snap lock components 140 and 150 from flexing away from interconnect card 112. In this example, hinge arm 118 and flex latch 160 may securely lock interconnect card 112 in position above main board 110. In certain examples, if a force is exerted against the ramp portion in a direction that is opposite of snap lock component 140, hinge joint 152 may unflex and automatically cause hinge arm 118 to transition from the locked position back to the initial or open position.

When interconnect card 112 is locked in position, option card 104 may be inserted within chassis 102 of information handling system 100 in the direction of arrow 602. In an example, while option card is being inserted into chassis 102 in the direction of arrow 602, the edges of the option card may slide along card guide channel 156 and the corresponding card guide channel of card guide 114. In certain examples, connector 130 may be substantially aligned with card guide channel 156 so that when option card 104 is fully inserted within chassis 102, connector 170 of the option card may interface with connector 130 as shown in FIG. 7.

Figure 7:
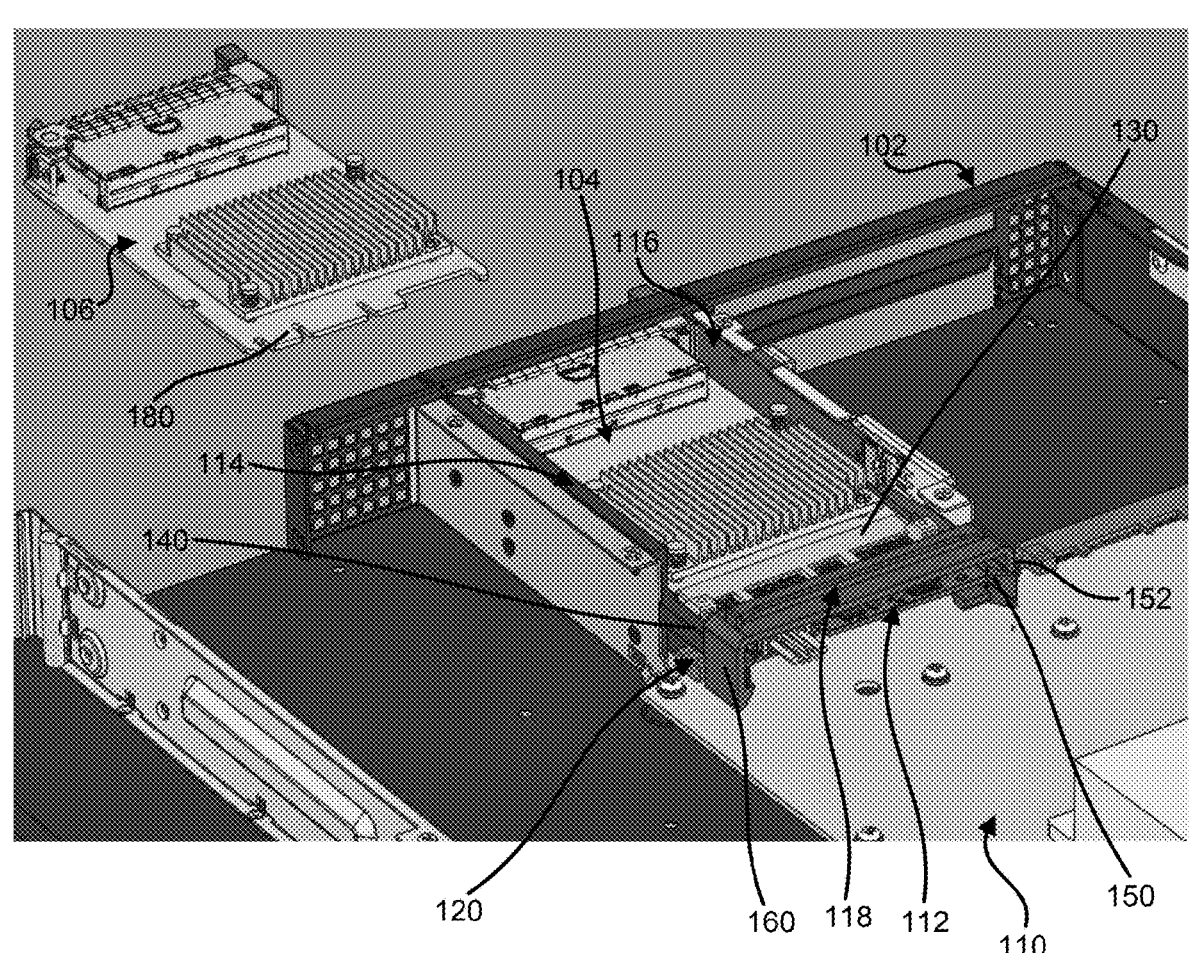

Referring to FIG. 7, option card 104 may be fully inserted within chassis 102 and securely connected to connector 130 of interconnect card 112. Based on the physical and electrical communication between option card 104 and interconnect card 112, the option card may communicate with other components of information handling system 100. For example, option card 104 may communicate with interconnect card 112, with components on main board 110, and components of information handling system 100. As described herein, card guides 114 and 116, hinge arm 118, and hinge joint 152 may combine to enable different interconnect cards 112 and different option cards 104 to be plugged into information handling system 102, such that the option card may communicate with other components of the information handling system.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
an interconnect card;
a first card guide in physical communication with the interconnect card; and
a second card guide in physical communication with the interconnect card, the second card guide including:
a hinge arm configured to transition between an open position and a locked position, wherein the hinge arm is in the open position when the interconnect card is inserted in between the first and second card guides, and the hinge arm is in the locked position to secure the interconnect card when the interconnect card is positioned between the first and second card guides; and
a hinge joint located in between a first snap lock component and the hinge arm, the hinge joint to flex as the hinge arm transitions between the open position and the locked position, wherein the first snap lock component flexes away from the interconnect card when the interconnect card is inserted in between the first and second card guides, and snap fits behind a first back corner of the interconnect card when the interconnect card is positioned between the first and second card guides.

2. The information handling system of claim 1, wherein the first card guide includes a second snap lock component, wherein the second snap lock component flexes away from the interconnect card when the interconnect card is inserted in between the first and second card guides, and the second snap lock component snap fits behind a second back corner of the interconnect card when the interconnect card is positioned between the first and second card guides.

3. The information handling system of claim 2, wherein the hinge arm includes a flex latch, the flex latch snap fits over the second snap lock component when the hinge arm is in the locked position.

4. The information handling system of claim 1, wherein the first snap lock component, the hinge joint, and the hinge arm are all a single all-in-one component.

5. The information handling system of claim 1, wherein the hinge joint automatically unflexes when the hinge arm is released from the locked position.

6. The information handling system of claim 5, wherein the hinge joint causes the hinge arm to transition toward the open position when the hinge joint unflexes.

7. An information handling system comprising:
a main board;
an interconnect card configured to communicate with the main board;
a first card guide in physical communication with the interconnect card;
a second card guide in physical communication with the interconnect card, the second card guide including a hinge arm configured to transition between an open position and a locked position, wherein the hinge arm is in the open position when the interconnect card is inserted between the first and second card guides, and the hinge arm is in the locked position to secure the interconnect card when the interconnect card is positioned between the first and second card guides and above the main board; and
a hinge joint located in between a first snap lock component and the hinge arm, the hinge joint to flex as the hinge arm transitions between the open position and the locked position, wherein the first snap lock component flexes away from the interconnect card when the interconnect card is inserted in between the first and second card guides, and snap fits behind a first back corner of the interconnect card when the interconnect card is positioned between the first and second card guides.

8. The information handling system of claim 7, wherein the first card guide includes a second snap lock component, wherein the second snap lock component flexes away from the interconnect card when the interconnect card is inserted in between the first and second card guides, and the second snap lock component snap fits behind a second back corner of the interconnect card when the interconnect card is positioned between the first and second card guides.

9. The information handling system of claim 8, wherein the hinge arm includes a flex latch, the flex latch snap fits over the second snap lock component when the hinge arm is in the locked position.

10. The information handling system of claim 7, wherein the first snap lock component, the hinge joint, and the hinge arm are all a single all-in-one component.

11. The information handling system of claim 7, wherein the hinge joint automatically unflexes when the hinge arm is released from the locked position.

12. The information handling system of claim 11, wherein the hinge joint causes the hinge arm to transition toward the open position when the hinge joint unflexes.

13. An information handling system comprising:
a main board;
an interconnect card configured to communicate with the main board;
a first card guide including a first snap lock component, the first snap lock component flexing away from the interconnect card when the interconnect card is inserted along the first card guide; and
a second card guide in physical communication with the interconnect card, the second card guide including:
a hinge arm configured to transition between an open position and a locked position, wherein the hinge arm is in the open position when the interconnect card is inserted in between the first and second card guides, and the hinge arm is in the locked position to secure the interconnect card when the interconnect card is positioned between the first and second card guides and above the main board; and a second snap lock component, the second snap lock component flexes away from the interconnect card when the interconnect card is inserted in between the first and second card guides, wherein the first snap lock component snap fits behind a first back corner of the interconnect card when the interconnect card is positioned between the first and second card guides, and wherein the second snap lock component snap fits behind a second back corner of the interconnect card when the interconnect card is positioned between the first and second card guides;

a hinge joint located in between the second snap lock component and the hinge arm, the hinge joint to flex as the hinge arm transitions between the open position and the locked position; and a flex latch on the hinge arm, the flex latch snap fits over the first snap lock component when the hinge arm is in the locked position.

14. The information handling system of claim 13, wherein the second snap lock component, the hinge joint, and the hinge arm are all a single all-in-one component.

15. The information handling system of claim 13, wherein the hinge joint automatically unflexes when the hinge arm is released from the locked position and causes the hinge arm to transition toward the open position when the hinge joint unflexes.

* * * * *